United States Patent
Kao et al.

(10) Patent No.: US 8,953,336 B2
(45) Date of Patent: Feb. 10, 2015

(54) SURFACE METAL WIRING STRUCTURE FOR AN IC SUBSTRATE

(75) Inventors: Chin-Fu Kao, Taipei (TW); Wen-Chih Chiou, Maoli (TW); Jing-Cheng Lin, Chu Tung Zhen (TW); Cheng-Lin Huang, Hsinchu (TW); Po-Hao Tsai, Zhongli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 246 days.

(21) Appl. No.: 13/412,958

(22) Filed: Mar. 6, 2012

(65) Prior Publication Data

US 2013/0233601 A1    Sep. 12, 2013

(51) Int. Cl.
H05K 7/10    (2006.01)

(52) U.S. Cl.
USPC ............................ 361/767; 174/257; 174/261

(58) Field of Classification Search
CPC ......... H01L 22/32; H01L 24/14; H01L 24/12; H01L 24/10
USPC ........... 174/257, 261; 361/767; 257/E23.179; 438/18
See application file for complete search history.

(56) References Cited

U.S. PATENT DOCUMENTS

| | | | |
|---|---|---|---|
| 4,811,082 A | 3/1989 | Jacobs et al. | |
| 4,990,462 A | 2/1991 | Silwa, Jr. | |
| 5,059,899 A * | 10/1991 | Farnworth et al. | 438/18 |
| 5,075,253 A | 12/1991 | Silwa, Jr. | |
| 5,380,681 A | 1/1995 | Hsu | |
| 5,481,133 A | 1/1996 | Hsu | |
| 6,002,177 A | 12/1999 | Gaynes et al. | |
| 6,187,678 B1 | 2/2001 | Gaynes et al. | |
| 6,229,216 B1 | 5/2001 | Ma et al. | |
| 6,236,115 B1 | 5/2001 | Gaynes et al. | |
| 6,271,059 B1 | 8/2001 | Bertin et al. | |
| 6,279,815 B1 | 8/2001 | Correia et al. | |
| 6,355,501 B1 | 3/2002 | Fung et al. | |
| 6,434,016 B2 | 8/2002 | Zeng et al. | |
| 6,448,661 B1 | 9/2002 | Kim et al. | |
| 6,461,895 B1 | 10/2002 | Liang et al. | |
| 6,477,046 B1 * | 11/2002 | Stearns et al. | 361/704 |
| 6,562,653 B1 | 5/2003 | Ma et al. | |
| 6,570,248 B1 | 5/2003 | Ahn et al. | |
| 6,573,113 B1 * | 6/2003 | Low et al. | 438/18 |
| 6,600,222 B1 | 7/2003 | Levardo | |
| 6,607,938 B2 | 8/2003 | Kwon et al. | |
| 6,661,085 B2 | 12/2003 | Kellar et al. | |
| 6,762,076 B2 | 7/2004 | Kim et al. | |
| 6,790,748 B2 | 9/2004 | Kim et al. | |
| 6,887,769 B2 | 5/2005 | Kellar et al. | |
| 6,908,565 B2 | 6/2005 | Kim et al. | |
| 6,908,785 B2 | 6/2005 | Kim | |
| 6,924,551 B2 | 8/2005 | Rumer et al. | |
| 6,943,067 B2 | 9/2005 | Greenlaw | |
| 6,946,384 B2 | 9/2005 | Kloster et al. | |
| 6,975,016 B2 | 12/2005 | Kellar et al. | |

(Continued)

*Primary Examiner* — Tuan T Dinh
*Assistant Examiner* — Steven T Sawyer
(74) *Attorney, Agent, or Firm* — Duane Morris LLP

(57) ABSTRACT

A surface metal wiring structure for a substrate includes one or more functional μbumps formed of a first metal and an electrical test pad formed of a second metal for receiving an electrical test probe and electrically connected to the one or more functional μbumps. The surface metal wiring structure also includes a plurality of sacrificial μbumps formed of the first metal that are electrically connected to the electrical test pads, where the sacrificial μbumps are positioned closer to the electrical test pad than the one or more functional μbumps.

20 Claims, 6 Drawing Sheets

(56) References Cited

U.S. PATENT DOCUMENTS

| | | |
|---|---|---|
| 7,037,804 B2 | 5/2006 | Kellar et al. |
| 7,056,807 B2 | 6/2006 | Kellar et al. |
| 7,087,538 B2 | 8/2006 | Staines et al. |
| 7,151,009 B2 | 12/2006 | Kim et al. |
| 7,157,787 B2 | 1/2007 | Kim et al. |
| 7,215,033 B2 | 5/2007 | Lee et al. |
| 7,276,799 B2 | 10/2007 | Lee et al. |
| 7,279,795 B2 | 10/2007 | Periaman et al. |
| 7,307,005 B2 | 12/2007 | Kobrinsky et al. |
| 7,317,256 B2 | 1/2008 | Williams et al. |
| 7,320,928 B2 | 1/2008 | Kloster et al. |
| 7,345,350 B2 | 3/2008 | Sinha |
| 7,402,442 B2 | 7/2008 | Condorelli et al. |
| 7,402,515 B2 | 7/2008 | Arana et al. |
| 7,410,884 B2 | 8/2008 | Ramanathan et al. |
| 7,432,592 B2 | 10/2008 | Shi et al. |
| 7,494,845 B2 | 2/2009 | Hwang et al. |
| 7,528,494 B2 | 5/2009 | Furukawa et al. |
| 7,531,890 B2 | 5/2009 | Kim |
| 7,557,597 B2 | 7/2009 | Anderson et al. |
| 7,576,435 B2 | 8/2009 | Chao |
| 7,834,450 B2 | 11/2010 | Kang |
| 2002/0162997 A1* | 11/2002 | Kato ............... 257/48 |
| 2002/0180026 A1* | 12/2002 | Liu et al. ............... 257/692 |
| 2003/0042483 A1* | 3/2003 | Devereaux ............... 257/48 |
| 2005/0046473 A1* | 3/2005 | Furue ............... 327/565 |
| 2006/0028221 A1* | 2/2006 | Hasegawa ............... 324/754 |
| 2007/0152339 A1* | 7/2007 | Jow et al. ............... 257/758 |
| 2008/0017856 A1* | 1/2008 | Fujino ............... 257/48 |
| 2008/0135840 A1* | 6/2008 | Peng et al. ............... 257/48 |
| 2010/0001268 A1* | 1/2010 | Frye et al. ............... 257/48 |
| 2010/0148812 A1* | 6/2010 | Nagai et al. ............... 324/754 |
| 2011/0062595 A1* | 3/2011 | Sim et al. ............... 257/775 |
| 2012/0074541 A1* | 3/2012 | Ito et al. ............... 257/659 |
| 2012/0326146 A1* | 12/2012 | Hui et al. ............... 257/48 |

* cited by examiner

SURFACE METAL WIRING STRUCTURE FOR AN IC SUBSTRATE

FIELD

The disclosed subject matter generally relates to electronic packaging technology.

BACKGROUND

Integrated circuit (IC) electronic packaging technologies can include components such as semiconductor interposers that have surface wiring features. The components such as semiconductor interposers are used to interconnect one or more IC devices into functional assemblies and the surface wiring features provide the interconnecting wiring between the one or more IC devices. The surface wiring features are often constructed in multi-layered structure similar to the back-end-of-the-line wiring layers in an IC device.

The surface wiring features also includes a plurality of functional micro bumps (μbumps) that are provided in an array to which the IC devices can be joined. The functional μbumps can be in the form of an array of Cu based metal pads on each of which a solder bump is formed to provide an array of solder bumps for joining an IC device thereto. The μbumps also can be in the form of an array of Cu posts (a.k.a. Cu columns). The tops of the Cu posts are finished with a layer of solder for joining an IC device thereto.

In many 3D-IC process, aluminum or aluminum-based electrical test pads connected to the functional μbumps are formed of a different metal, such as, copper, copper-based alloy, or solder (e.g. Sn—Ag, Sn—Ag—Cu, etc.). Because the electrical test pads and the functional μbumps are formed of different metals, the chemical potential between the two metals drive a galvanic process when the electrical test pads and the functional μbumps are exposed to wet chemical processes with solutions having low resistivity.

Referring to FIG. 1, an example of a surface metal structure having two different metals on an electronic packaging structure 10 will be used to describe galvanic effect. FIG. 1 shows a functional metal feature 2 made of a first metal and an electrical test pad 3 made of a second metal provided on a substrate 10 of an IC device. The functional metal feature 2 can be the functional μbumps mentioned above. In the illustrated example, the functional metal feature 2 is made primarily of copper and the electrical test pad 3 is made of aluminum. The functional μbump 2 and the electrical test pad 3 are electrically connected to each other by their respective wiring features 2W and 3W and vias 70. The standard reduction potential $E_0$ of aluminum is 1.66V compared to the $E_0$ of copper, which is −0.34V. This difference in the reduction potential between the two metals drive a galvanic process expressed by

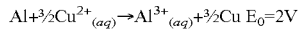

$$Al + \tfrac{3}{2}Cu^{2+}_{(aq)} \rightarrow Al^{3+}_{(aq)} + \tfrac{3}{2}Cu \quad E_0 = 2V$$

When the Al electrical test pads and the Cu functional μbumps are exposed to wet chemical processes with solutions having low resistivity, the aqueous electrolyte in the solution and the internal wiring in the substrate 10 that connects the Al test pad 3 and the Cu μbump 2 completes a circuit and form a galvanic cell. A cathodic reaction (reduction) takes place at the Al test pad 3 and an anodic reaction (oxidation) takes place at the Cu μbump 2. The anodic reaction, $M^{2+} + 2e^- \rightarrow M$, results in deposition of impurity metal particles (mostly Al metal dissolved in the aqueous solution from the cathodic reaction and/or formed a oxidation layer) at the Cu μbump 2 which is not desired because such impurities will interfere with wetting of solder to the Cu μbump 2 in subsequent processes.

Electroless Nickel Electroless Palladium Immersion Gold (ENEPIG) metal layer is often used to provide a surface finishing layer over the functional μbumps during assembly processes. Precious metals as Gold, Silver and Palladium have very good properties on durability and chemical resistance.

The ENEPIG surface finishing process is one kind of electroless plating technology that does not require photolithographic process. However, it now faces a problem for 3D-IC package process. Because photolithographic process is used to protect the non-process areas such as aluminum pads in some embodiment, photoresist will leach out at high temperature during the ENEPIG surface fishing process. The resulting residual photoresist are sources of contamination for the chemicals used in the subsequent wet chemical process. For example, the photoresist can contaminate a plating bath shortening the plating bath life and also can redeposit on functional copper metal features resulting in defects that lowers the product yield. This results in higher cost for the 3D-IC manufacturing process. The ENEPIG surface finishing is an exemplary process that illustrate the galvanic damage in some specific embodiments of 3D-IC integrated package process, and do not limit the scope of the embodiments of electroless plating technology. Generally, those packaging processes that can provide an external conducting path may suffer galvanic damage.

Figure 1:
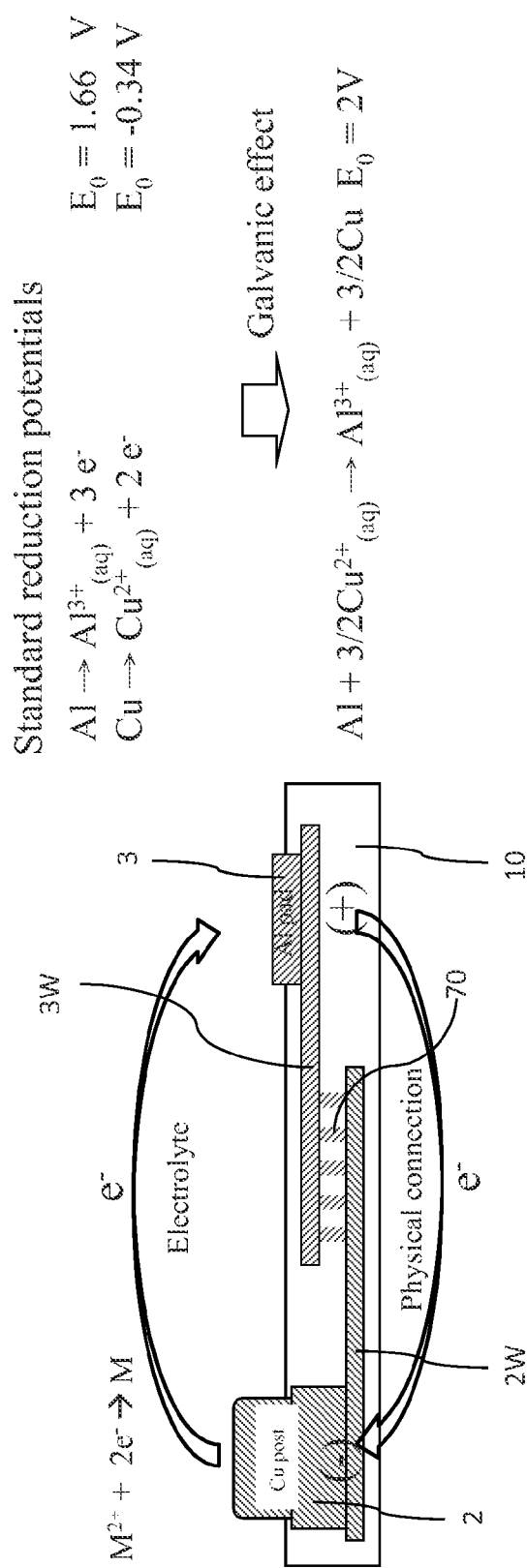
FIG. 1 is a schematic diagram illustrating galvanic effect caused by two metals with different reduction potentials.

The drawing figures are schematic illustrations and they are not intended to provide precise dimensions.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

In order to ensure that the final assembly of the IC devices and the semiconductor interposers are functional upon completion of the assembly, each component pieces such as the IC devices and the semiconductor interposers are tested beforehand to verify their electrical integrity. For example, in the case of semiconductor interposers, in order to test the continuity of the interposer's functional back-end wiring features, test pads are provided to accommodate test probes for electrical testing of the back-end wiring features. The test pads are generally formed of aluminum or aluminum alloys and they are electrically connected to the functional back-end wiring features that are generally formed of copper or copper alloys. Because these structures are made from different metals, they are subject to the galvanic effect described above. Therefore, there is a need to reduce and minimize the undesirable galvanic effect on the functional wiring features.

Figure 2:
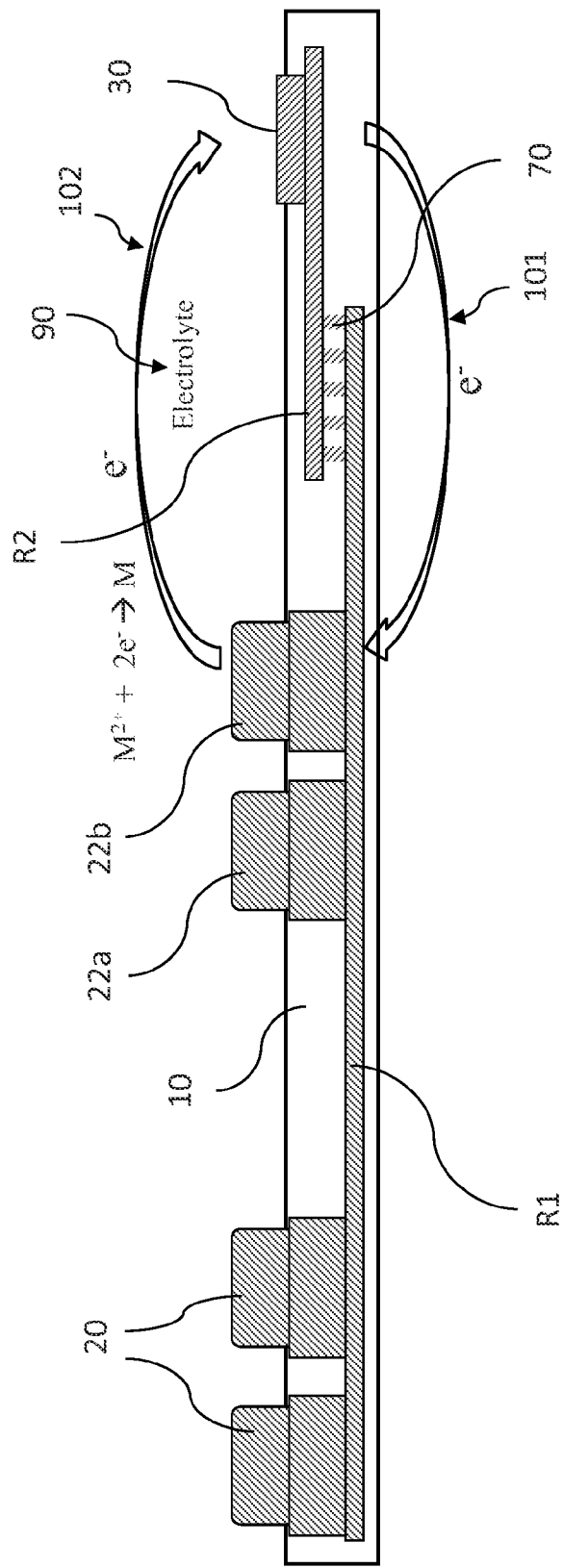
FIG. 2 is a schematic cross-sectional diagram of a wiring metal feature according to an embodiment.

FIG. 2 shows a surface metal wiring structure on a substrate 10, the surface metal wiring structure comprising features formed of different metals. In one embodiment, the surface metal wiring structure comprises one or more functional μbumps 20 formed of a first metal, an electrical test pad 30 formed of a second metal, where the first and second metal are different. Generally, the electrical test pad 30 is provided on the substrate 10 for receiving an electrical test probe (not shown). The electrical test pad 30 and the one or more functional μbumps 20 are electrically connected by a first wiring connection R1 and a second wiring connection R2 provided internal to the substrate 10. The first wiring connection R1 is made of the first metal and the second wiring connection R2 is made of the second metal. The connection between the first wiring connection R1 the second wiring connection R2 can be made by any appropriate connection structure such as a plurality of vias 70 shown.

As shown, the surface metal wiring structure also comprises a plurality of sacrificial μbumps 22a, 22b formed of the first metal and electrically connected to the first wiring connection R1 and positioned between the one or more functional μbumps 20 and the electrical test pad 30 such that the plurality of sacrificial μbumps 22a, 22b are closer to the electrical test pad 30 than the functional μbumps 20.

The shorter distance between the sacrificial μbumps 22a, 22b and the electrical test pad 30 provides lower electrical resistance pathway for the galvanic process and promotes the preferential galvanic effect. When the surface metal wiring structure is exposed to an environment of a liquid chemical with low resistivity such as in the aforementioned electroless plating or electro-chemical plating process, the galvanic process on the functional μbumps 20 and the sacrificial μbumps 22a, 22b occurs preferentially on the sacrificial μbumps 22a, 22b rather than the one or more functional μbumps 20. Thus the undesirable effects of the galvanic process on the one or more functional μbumps 20 is reduced and/or minimized.

Therefore, the novel configuration described herein substantially reduces the galvanic damage to the functional μbumps 20. The lower the electrical resistance is for the pathway between the sacrificial μbumps 22a, 22b and the electrical test pad 30 compared to the pathway between the one or more functional μbumps 20 and the electrical test pad 30, the lower the galvanic damage will be at the functional μbumps 20.

According to another embodiment where the sacrificial μbumps 22a, 22b have the same metal composition as the functional μbumps 20, the sacrificial μbumps can be positioned closer to the electrical test pad than the one or more functional μbumps by about 3% to 97% to promote the preferential galvanic effect. In other words, the distance between the sacrificial μbumps 22a, 22b and the electrical test pad 30 is between about 97% to about 3% of the distance between the one or more functional μbumps 20 and the electrical test pad. In another embodiment, the distance between the sacrificial μbumps 22a, 22b and the electrical test pad 30 is about 30% of the distance between the one or more functional μbumps 20 and the electrical test pad. In other words the distance between the sacrificial μbumps 22a, 22b and the electrical test pad 30 is about 70% shorter than the distance between the one or more functional μbumps 20 and the electrical test pad.

Another way to reduce the electrical resistance of the pathway between the sacrificial μbumps 22a, 22b and the electrical test pad 30, is to make the surface are of the sacrificial μbumps 22a, 22b larger than the surface area of the functional μbumps 20. Larger surface area for the sacrificial μbumps also promotes the preferential galvanic effect by reducing the contact resistance with the electrolytes. According to an embodiment, each of the plurality of sacrificial μbumps 22a, 22b has a surface area that is equal to or greater than the surface are of each of the one or more functional μbumps 20. According to another embodiment, each of the plurality of sacrificial μbumps 22a, 22b has a surface area that is up to 10% larger than the surface area of each of the one or more functional μbumps 20. In another embodiment, each of the plurality of sacrificial μbumps 22a, 22b has a surface area that is up to 30% larger than the surface area of each of the one or more functional μbumps 20.

According to another embodiment, the number of sacrificial μbumps connected to the one or more functional μbumps is same as or greater than the number of functional μbumps, thus, the aggregate surface area of the sacrificial μbumps is greater than the aggregate surface area of the one or more functional μbumps, in order to further promote the preferential galvanic effect.

In one embodiment, the first metal forming the functional μbumps 20, the sacrificial μbumps 22a, 22b and the first wiring connection R1 is copper or a copper-based alloy. The second metal forming the electrical test pad 30 and the second wiring connection R2 can be aluminum or an aluminum alloy such as Al—Cu.

Figure 3:
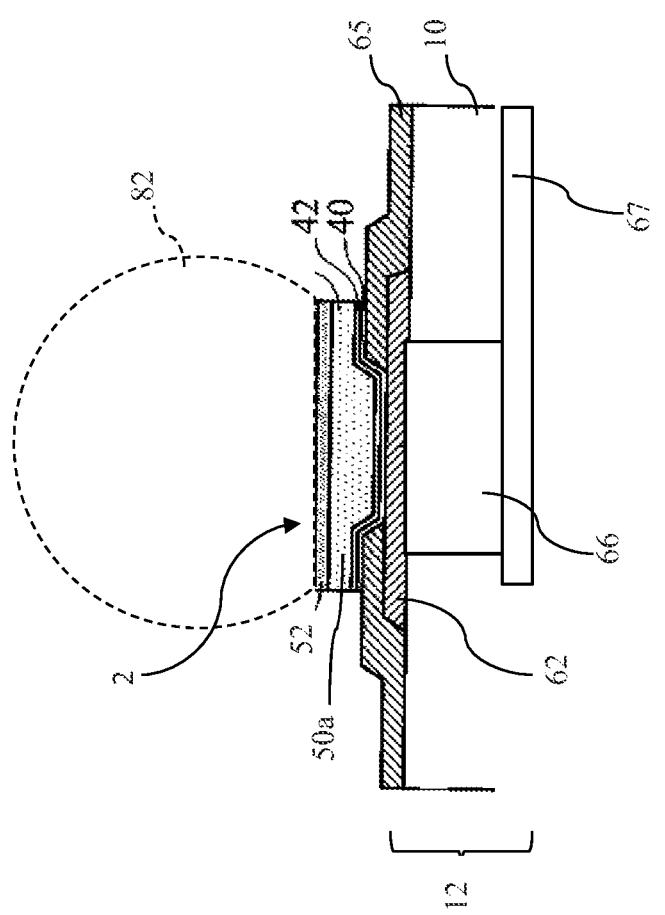
FIG. 3 shows a schematic cross-sectional diagram of a UBM type functional μbump structure on a wafer substrate.
Figure 4:
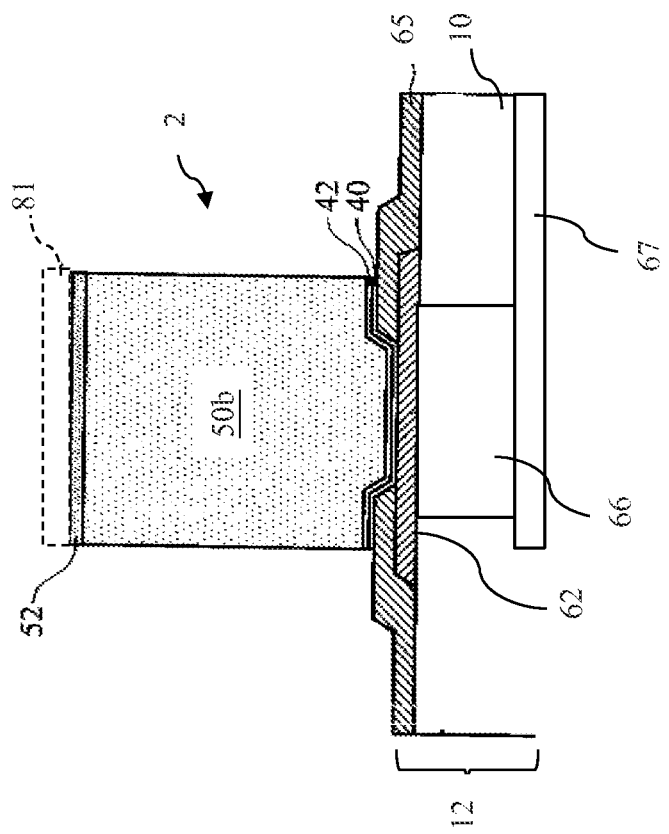
FIG. 4 shows a schematic cross-sectional diagram of a copper post type functional μbump structure on a wafer substrate.

Referring to FIGS. 3 and 4, detailed structure of some examples of functional μbumps will be described. FIG. 3 shows an example of a functional μbump 2 wherein the μbump is an under bump metallurgy (UBM). The "bump" in UBM generally refers to the solder bump that is formed on the UBM. The μbump structure 2 is formed on a wafer substrate 10. The substrate 10 can be a semiconductor substrate, such as a bulk silicon substrate, although it may include other semiconductor materials, such as group III, group IV, and/or group V elements. An interconnect structure 12, which includes metal lines 67 and vias 66 formed therein. The metal lines 67 and vias 66 may be formed of copper or copper alloys. A metal pad 62 is formed over the interconnect structure 12. The metal pad 62 may comprise aluminum, and hence may also be referred to as aluminum pad 62, although it may also be formed of, or include, other materials, such as copper, silver, gold, nickel, tungsten, alloys thereof, and/or multi-layers thereof. A passivation layer 65 is formed to cover edge portions of metal pad 62. The passivation layer 65 may be formed of polyimide or other known dielectric materials. Additional passivation layers may be formed over interconnect structure 12 and at the same level, or over, metal pad 62. The additional passivation layers may be formed of materials such as silicon oxide, silicon nitride, un-doped silicate glass (USG), polyimide, and/or multi-layers thereof. A diffusion barrier layer 40 is provided over the metal pad 62 and contacts the metal pad 62 through an opening provided in the passivation layer 65. A thin seed layer 42 is formed on the diffusion barrier layer 40. The diffusion barrier layer 40 may be made of titanium, titanium nitride, tantalum, or a tantalum nitride. The seed layer 42 can be made of copper or copper alloy. A copper layer 50a is formed on the copper seed layer 42. A metal layer 52 can be optionally formed on the copper layer 50a. The metal layer 52 can be nickel or nickel alloy. Generally, a solder bump 82 is formed on the UBM 2 by forming a layer of solder on the metal layer 52 by plating, for example, and reflowing the solder to form the solder bump 82 illustrated in dotted line.

FIG. 4 shows another variation of the functional μbump 2. Compared to the UBM version shown in FIG. 3, the thickness of the copper layer 50b is increased so that copper layer 50b forms a taller interconnection requiring smaller amount of solder for the connection to the next level packaging structure. This is generally referred to in the art as a copper post or copper pillar.

Figure 5:
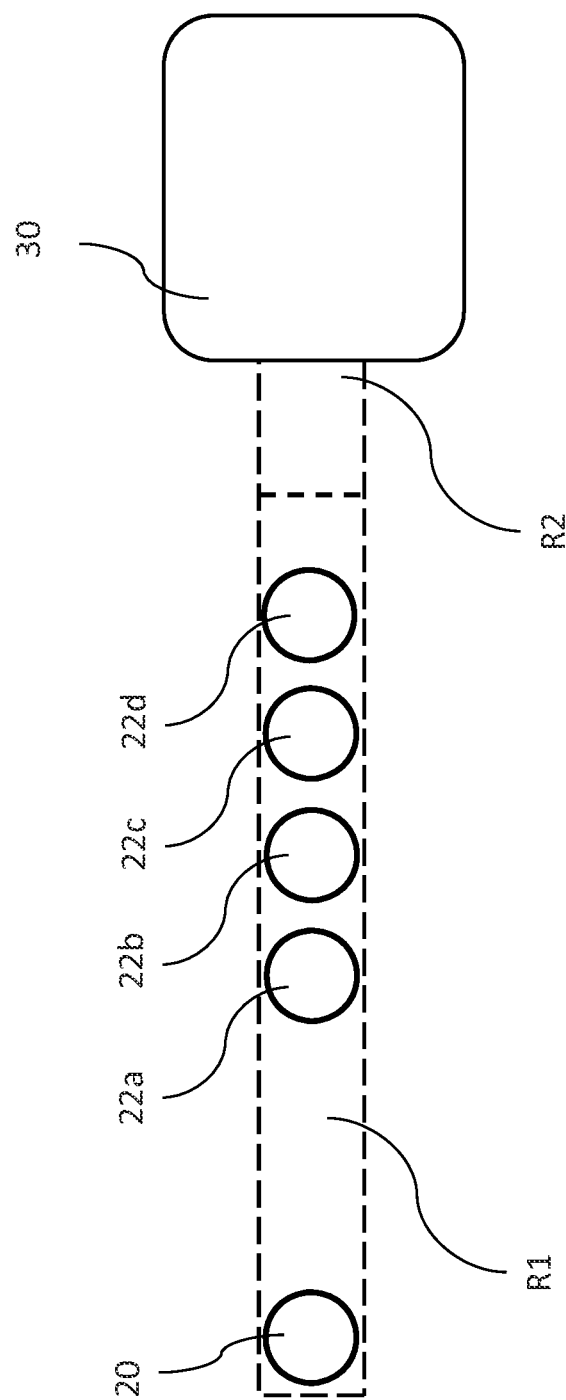
FIG. 5 is a schematic diagram of a top-down view of another wiring metal feature according to the present disclosure.

FIG. 5 shows a top-down view of another example of a surface metal wiring structure on a substrate, such as a semiconductor interposer or an IC device, according to the present disclosure. In this example, one functional μbump 20 is provided and the plurality of sacrificial μbumps includes four such μbumps 22a, 22b, 22c, and 22d that are provided between the functional μbump 20 and the electrical test pad 30. The sacrificial μbumps are in a linear arrangement. The first wiring connection R1 and the second wiring connection R2 connecting the functional μbumps, the sacrificial μbumps and the electrical test pad together are illustrated in dotted lines. The sacrificial μbumps also can be formed in any geometric shape as appropriate.

Figure 6:
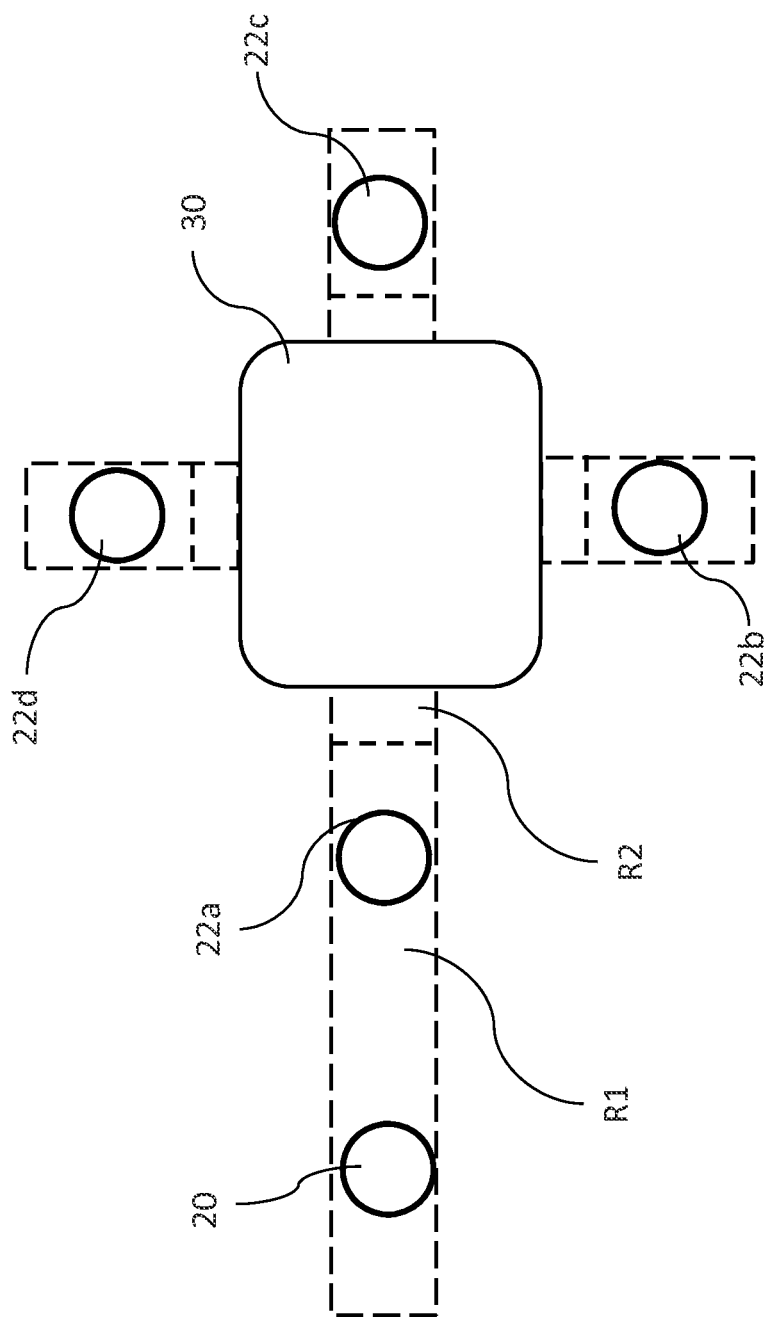
FIG. 6 is a schematic diagram of a top-down view of another wiring metal feature according to the present disclosure.

FIG. 6 shows a top-down view of another example of a surface metal wiring structure on a substrate. In this example, one functional μbump 20 is provided and the plurality of sacrificial μbumps 22a, 22b, 22c and 22d are positioned around the electrical test pad 30. The sacrificial μbumps are closer to the electrical test pad 30 than the functional μbump 20.

According to an embodiment, a surface metal wiring structure for an IC substrate comprises one or more functional μbumps formed of a first metal, an electrical test pad formed of a second metal for receiving an electrical test probe and electrically connected to the one or more functional μbumps, wherein the first and second metal are different, and a plurality of sacrificial μbumps formed of the first metal and electrically connected to the electrical test pads, wherein the sacrificial μbumps are positioned closer to the electrical test pad than the one or more functional μbumps.

Although the subject matter has been described in terms of exemplary embodiments, it is not limited thereto. Rather, the appended claims should be construed broadly, to include other variants and embodiments, which may be made by those skilled in the art.

What is claimed is:

1. A surface metal wiring structure for a substrate comprising:
    one or more functional μbumps formed of a first metal;
    an electrical test pad formed of a second metal for receiving an electrical test probe and electrically connected to the one or more functional μbumps, wherein the first and second metals are different;
    a plurality of sacrificial μbumps formed of the first metal and electrically connected to the electrical test pad, wherein the sacrificial μbumps are positioned closer to the electrical test pad than the one or more functional μbumps, wherein the electrical connection between the plurality of sacrificial μbumps and the test pad provides a pathway for a galvanic process having a lower electrical resistance than the electrical connection between the functional μbumps and the test pad.

2. The surface metal wiring structure according to claim 1, wherein the first metal is copper or a copper alloy.

3. The surface metal wiring structure according to claim 1, wherein the second metal is aluminum or an aluminum alloy.

4. The surface metal wiring structure according to claim 1, wherein the sacrificial μbumps are positioned closer to the electrical test pad than the one or more functional μbumps by about 3% to 97%.

5. The surface metal wiring structure according to claim 1, wherein the sacrificial μbumps are positioned closer to the electrical test pad than the one or more functional μbumps by about 70%.

6. The surface metal wiring structure according to claim 1, further wherein each of the plurality of sacrificial μbumps has up to 10% larger surface area than the one or more functional μbumps.

7. The surface metal wiring structure according to claim 1, further wherein each of the plurality of sacrificial μbumps has up to 30% larger surface area than the one or more functional μbumps.

8. The surface metal wiring structure according to claim 1, further wherein the plurality of sacrificial μbumps are provided in a number greater than or equal to the one or more functional μbumps.

9. A surface metal wiring structure for a substrate comprising:
    one or more functional μbumps formed of a first metal;
    an electrical test pad formed of a second metal for receiving an electrical test probe and electrically connected to the one or more functional μbumps, wherein the first and second metals are different;
    a plurality of sacrificial μbumps formed of the first metal and electrically connected to the electrical test pad, wherein the sacrificial μbumps are provided in a number greater than or equal to the one or more functional μbumps, wherein the electrical connection between the plurality of sacrificial μbumps and the test pad provides a pathway for a galvanic process having a lower electrical resistance than the electrical connection between the functional μbumps and the test pad.

10. The surface metal wiring structure according to claim 9, wherein the first metal is copper or a copper alloy.

11. The surface metal wiring structure according to claim 9, wherein the second metal is aluminum or an aluminum alloy.

12. The surface metal wiring structure according to claim 9, wherein the sacrificial μbumps are positioned closer to the electrical test pad than the one or more functional μbumps by about 3% to 97%.

13. The surface metal wiring structure according to claim 9, wherein the sacrificial μbumps are positioned closer to the electrical test pad than the one or more functional μbumps by about 70%.

14. The surface metal wiring structure according to claim 9, further wherein each of the plurality of sacrificial μbumps has up to 10% larger surface area than the one or more functional μbumps.

15. The surface metal wiring structure according to claim 9, further wherein each of the plurality of sacrificial μbumps has up to 30% larger surface area than the one or more functional μbumps.

16. The surface metal wiring structure according to claim 9, wherein the plurality of sacrificial μbumps are positioned closer to the electrical test pad than the one or more functional μbumps.

17. A surface metal wiring structure for a substrate comprising:
- a functional μbump formed of a first metal;
- an electrical test pad formed of a second metal for receiving an electrical test probe and electrically connected to the functional μbump, wherein the first and second metals are different;
- a plurality of sacrificial μbumps formed of the first metal and electrically connected to the electrical test pad, wherein the functional μbump, the plurality of sacrificial μbumps, and the electrical test pad are in a linear arrangement and the plurality of sacrificial μbumps are provided between the functional μbump and the electrical test pad, wherein the electrical connection between the plurality of sacrificial μbumps and the test pad provides a pathway for a galvanic process having a lower electrical resistance than the electrical connection between the functional μbumps and the test pad.

18. The surface metal wiring structure according to claim 17, wherein the first metal is copper or a copper alloy.

19. The surface metal wiring structure according to claim 17, wherein the second metal is aluminum or an aluminum alloy.

20. The surface metal wiring structure according to claim 17, wherein each of the plurality of sacrificial μbumps has up to 10% larger surface area than the functional μbump.

* * * * *